（12) United States Patent
Senapati et al.

(10) Patent No.: US 11,101,812 B2
(45) Date of Patent: *Aug. 24, 2021

(54) ANALOG-TO-DIGITAL CONVERTER CONTROLLERS INCLUDING CONFIGURABLE CONTEXTS

(71) Applicant: Microchip Technology Incorporated, Chandler, AZ (US)

(72) Inventors: Ashish Senapati, Tempe, AZ (US); Kevin Kilzer, Chandler, AZ (US); Prashanth Pulipaka, Karnataka (IN)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/731,534

(22) Filed: Dec. 31, 2019

(65) Prior Publication Data

US 2020/0136635 A1 Apr. 30, 2020

Related U.S. Application Data

(63) Continuation of application No. 16/162,135, filed on Oct. 16, 2018, now Pat. No. 10,536,156.

(51) Int. Cl.
*H03M 1/12* (2006.01)
(52) U.S. Cl.
CPC ................................ *H03M 1/1225* (2013.01)
(58) Field of Classification Search
CPC .................................................. H03M 1/1225
USPC ................................................. 341/130–160
See application file for complete search history.

(56) References Cited

U.S. PATENT DOCUMENTS

| 6,751,772 | B1 * | 6/2004 | Kim | H03M 13/2957 |
| | | | | 714/786 |
| 8,046,564 | B2 * | 10/2011 | Yang | G06F 7/483 |
| | | | | 712/15 |
| 9,282,126 | B1 * | 3/2016 | Mateer | H04M 3/493 |
| 10,146,609 | B1 * | 12/2018 | Leverich | G06F 11/0721 |
| 10,200,262 | B1 * | 2/2019 | Leverich | H04L 43/0823 |

(Continued)

FOREIGN PATENT DOCUMENTS

| EP | 1304807 A1 * | 4/2003 | ............ H03M 1/004 |
| EP | 1304807 A1 | 4/2003 | |

OTHER PUBLICATIONS

International Search Report for International Application No. PCT/US2019/056094, dated Jan. 27, 2020, 4 pages.

(Continued)

*Primary Examiner* — Lam T Mai
(74) *Attorney, Agent, or Firm* — TraskBritt

(57) ABSTRACT

Various embodiments relate to analog-to-digital converter (ADC) controllers. An ADC controller may include a number of contexts configured for coupling to an ADC, wherein each context having at least one register for storing at least one configurable parameter. The ADC controller may also include a sequencer operatively coupled to the number of contexts and configured to perform a programmed conversion sequence based on one or more configurable parameters of one or more contexts of the number of contexts. Methods of performing an analog-to-digital (A/D) conversion sequence, and methods of configuring a number of contexts for an analog-to-digital converter (ADC) controller, are also disclosed.

20 Claims, 6 Drawing Sheets

(56) References Cited

U.S. PATENT DOCUMENTS

| | | | |
|---|---|---|---|
| 10,222,469 B1* | 3/2019 | Gillian | H04Q 9/00 |
| 10,536,156 B1* | 1/2020 | Senapati | H03M 1/1225 |
| 2009/0193475 A1* | 7/2009 | Halverson | H04N 21/234318 |
| | | | 725/87 |
| 2009/0204819 A1* | 8/2009 | Parker | G06F 21/36 |
| | | | 713/182 |
| 2012/0158472 A1* | 6/2012 | Singh | G06Q 30/0241 |
| | | | 705/14.4 |
| 2012/0265903 A1* | 10/2012 | Peled | G11B 5/09 |
| | | | 710/5 |
| 2014/0105272 A1* | 4/2014 | Bulusu | H04N 19/13 |
| | | | 375/240.02 |
| 2014/0359191 A1 | 12/2014 | Pedersen et al. | |
| 2017/0149882 A1* | 5/2017 | Roy | H04L 67/1065 |
| 2018/0052646 A1* | 2/2018 | Capt | G06F 3/14 |

OTHER PUBLICATIONS

International Written Opinion for International Application No. PCT/US2019/056094, dated Jan. 27, 2020, 10 pages.

\* cited by examiner

ANALOG-TO-DIGITAL CONVERTER CONTROLLERS INCLUDING CONFIGURABLE CONTEXTS

CROSS-REFERENCE TO RELATED APPLICATION

This application is a continuation of U.S. patent application Ser. No. 16/162,135, filed Oct. 16, 2018, now U.S. Pat. No. 10,536,156, issued Jan. 14, 2020, the disclosure of which is hereby incorporated herein in its entirety by this reference.

FIELD

The present disclosure relates generally to analog-to-digital converter controllers, and more specifically, to analog-to-digital converter controllers including one or more configurable contexts, and methods for performing automated conversions based on one or more configured contexts.

BACKGROUND

Analog-to-digital converters (ADCs) accept an analog input signal (e.g., a voltage or a current), sample the input signal, and convert each sample of the input signal to a digital value that can be read by, for example, a microcontroller, a microprocessor, a digital circuit, etc. An ADC controller, including an ADC, is typically required to handle many input signals, wherein each input signal may be associated with a specific application. Conventional ADC controllers may sample and convert an analog input signal to a digital signal on a single input channel, wherein the input channel and the input signal are associated with a specific application (e.g., temperature sensing). Other analog input signals, which are associated with other applications (e.g., strain sensing, capacitor sensing, etc.), may be received on other input channels. Converting and computing on multiple input channels may increase overhead for an ADC controller.

BRIEF DESCRIPTION OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

DETAILED DESCRIPTION

Figure 1:
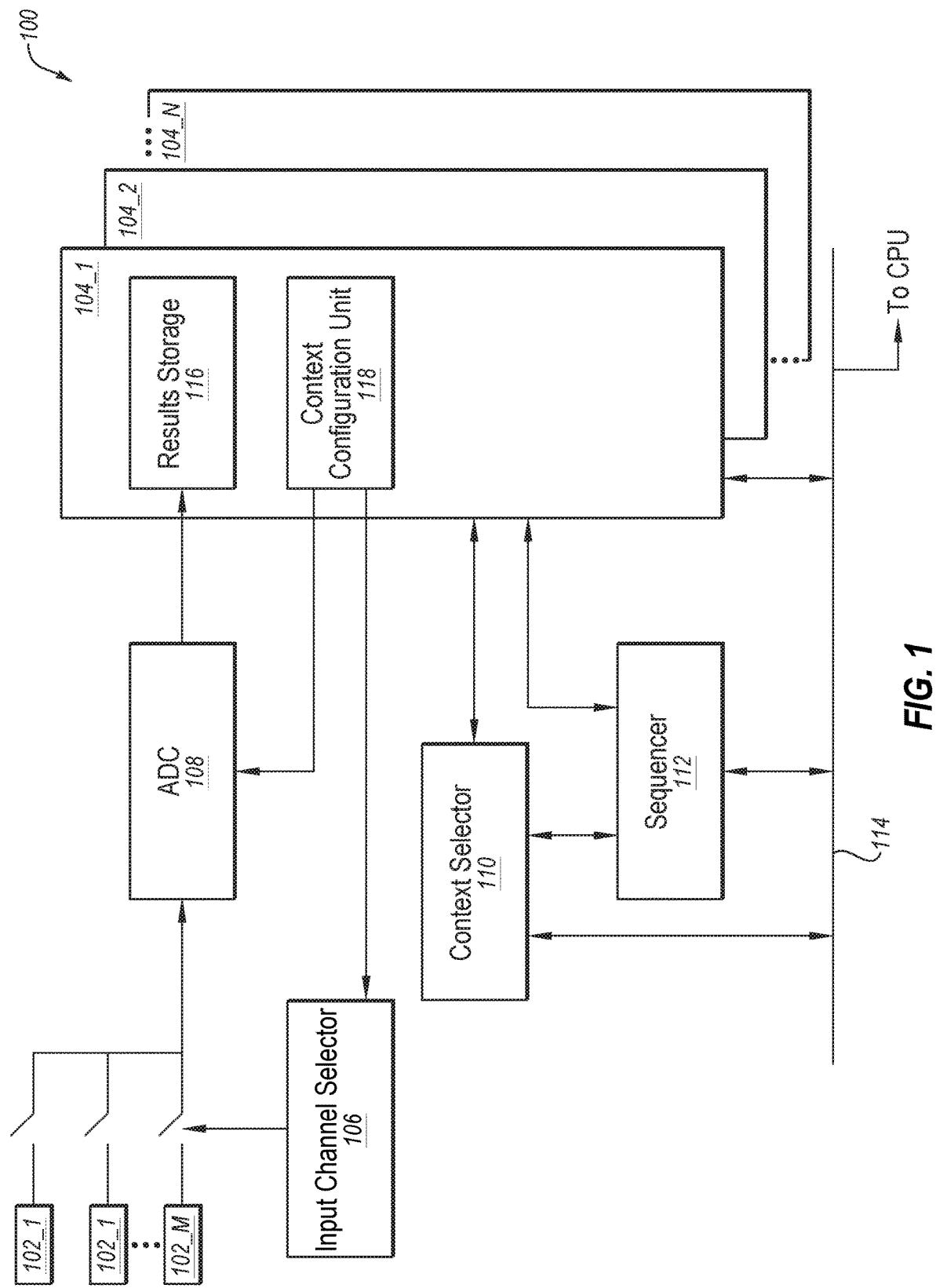
FIG. 1 illustrates an example device including an analog-to-digital converter (ADC) and a number of contexts, in accordance with one or more embodiments of the disclosure.

In the following detailed description, reference is made to the accompanying drawings, which form a part hereof, and in which are shown, by way of illustration, specific examples of embodiments in which the present disclosure may be practiced. These embodiments are described in sufficient detail to enable a person of ordinary skill in the art to practice the present disclosure. However, other embodiments may be utilized, and structural, material, and process changes may be made without departing from the scope of the disclosure.

The illustrations presented herein are not meant to be actual views of any particular method, system, device, or structure, but are merely idealized representations that are employed to describe the embodiments of the present disclosure. The drawings presented herein are not necessarily drawn to scale. Similar structures or components in the various drawings may retain the same or similar numbering for the convenience of the reader; however, the similarity in numbering does not mean that the structures or components are necessarily identical in size, composition, configuration, or any other property.

The following description may include examples to help enable one of ordinary skill in the art to practice the disclosed embodiments. The use of the terms "exemplary," "by example," and "for example," means that the related description is explanatory, and though the scope of the disclosure is intended to encompass the examples and legal equivalents, the use of such terms is not intended to limit the scope of an embodiment or this disclosure to the specified components, steps, features, functions, or the like.

It will be readily understood that the components of the embodiments as generally described herein and illustrated in the drawing could be arranged and designed in a wide variety of different configurations. Thus, the following description of various embodiments is not intended to limit the scope of the present disclosure, but is merely representative of various embodiments. While the various aspects of the embodiments may be presented in drawings, the drawings are not necessarily drawn to scale unless specifically indicated.

Furthermore, specific implementations shown and described are only examples and should not be construed as the only way to implement the present disclosure unless specified otherwise herein. Elements, circuits, and functions may be shown in block diagram form in order not to obscure the present disclosure in unnecessary detail. Conversely, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Those of ordinary skill in the art would understand that information and signals may be represented using any of a variety of different technologies and techniques. For example, data, instructions, commands, information, signals, bits, symbols, and chips that may be referenced throughout this description may be represented by voltages, currents, electromagnetic waves, magnetic fields or particles, optical fields or particles, or any combination thereof. Some drawings may illustrate signals as a single signal for clarity of presentation and description. It will be understood by a person of ordinary skill in the art that the signal may represent a bus of signals, wherein the bus may have a variety of bit widths and the present disclosure may be implemented on any number of data signals including a single data signal.

The various illustrative logical blocks, modules, and circuits described in connection with the embodiments disclosed herein may be implemented or performed with a general purpose processor, a special purpose processor, a Digital Signal Processor (DSP), an Integrated Circuit (IC), an Application Specific Integrated Circuit (ASIC), a Field Programmable Gate Array (FPGA) or other programmable logic device, discrete gate or transistor logic, discrete hardware components, or any combination thereof designed to perform the functions described herein. A general-purpose processor (may also be referred to herein as a host processor or simply a host) may be a microprocessor, but in the alternative, the processor may be any conventional processor, controller, microcontroller, or state machine. A processor may also be implemented as a combination of computing devices, such as a combination of a DSP and a microprocessor, a plurality of microprocessors, one or more microprocessors in conjunction with a DSP core, or any other such configuration. A general-purpose computer including a processor is considered a special-purpose computer while the general-purpose computer is configured to execute computing instructions (e.g., software code) related to embodiments of the present disclosure.

The embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a thread, a function, a procedure, a subroutine, a subprogram, etc. Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another.

Any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise, a set of elements may comprise one or more elements.

As used herein, the term "substantially" in reference to a given parameter, property, or condition means and includes to a degree that one of ordinary skill in the art would understand that the given parameter, property, or condition is met with a small degree of variance, such as, for example, within acceptable manufacturing tolerances. By way of example, depending on the particular parameter, property, or condition that is substantially met, the parameter, property, or condition may be at least 90% met, at least 95% met, or even at least 99% met.

Analog-to-digital converter (ADC) controllers may include a number of control, state, status, and information parameters for supporting A/D conversion. A set of parameters may apply to only one or a few analog input channels, while other input channels (e.g., other applications) may require different sets of parameters. More specifically, for each A/D conversion (e.g., for each application), an ADC controller may need to be programmed based on an associated input signal and/or application. In conventional systems, to switch from a first input channel (e.g., an input channel that receives a signal from a temperature sensor) to a second, different input channel (e.g., an input channel that receives a signal from a strain gauge), a set of parameters for the first input channel is stored and a set of parameters for the second input channel is loaded. Typically, conventional systems are not core independent (i.e., a CPU core is programmed for data movement (i.e., storing and loading parameter sets)) and, thus, programming or reprogramming an ADC controller for each input channel may be time-consuming (e.g., when executed by software), may require additional memory, may require modifying the programming for different CPU cores, and may increase overhead with a core processor. Further, other conventional systems may include multiple ADCs (e.g., one for each input channel). However, this also increases overhead.

As used herein, the term "context" may refer to a set of registers (e.g., special functional registers (SFRs) and data registers). For example, one "context" may be associated with a first application (e.g., temperature sensing application) and/or a first input channel (e.g., an input channel configured to receive an analog signal from a temperature sensor), and another "context" may be associated with a second application (e.g., capacitive sensing application) and/or a second input channel (e.g., an input channel configured to receive an analog signal from a capacitive sensor). Further, as used herein, the terms "configured context" and "programmed context" may refer to a context configured (e.g., by a user (e.g., a programmer) via a software application) with one or more user-defined parameters (e.g., for a specific operation and/or a programmed conversion sequence).

Various embodiments disclosed herein relate to ADC controllers including one or more configurable contexts. More specifically, in some embodiments, during, for example, a configuration phase, at least one context of one or more contexts of an ADC controller may be configured. For example, a user (e.g., a programmer using a software application) may select a context and set one or more parameters of the selected context (e.g., via one or more context bits). More specifically, for example, for each selected context, the software (e.g., in response to input of a user) may set an input channel for the context. Further, for example, the software may select whether or not the selected context (and associated input channel) is to be included in programmed conversion sequence. As another example, the user may set one or more interrupt parameters for the selected context. For example, the user may configure contexts sequentially until each context of an ADC controller is configured.

Further, a configured context, which is associated with at least one input channel of a number of input channels, may be saved by the ADC controller. In at least some embodiments, a configured context may be treated (e.g., by software) as a unique instance of an ADC controller, and thus it may not be necessary to replicate an ADC controller in hardware. Thus, during conversion on one or more input channels, it may not be necessary for the ADC controller to transfer data (i.e., parameter sets associated with the one or more input channels) in and out of a central processing unit (CPU).

Moreover, according to some embodiments, conversions on a number of channels (e.g., using a number of configured contexts) may be performed via an automated, core-independent process (also referred to herein as a "programmed sequence" or a "programmed conversion sequence"). More specifically, in some embodiments, during, for example, an execution phase (also referred to herein as a "conversion phase" or a "computation phase") of an ADC controller, a conversion for each input channel selected for conversion may be performed in a programmed sequence, wherein the programmed sequence may be based on one or more configured contexts of the ADC controller.

In some embodiments, a programmed sequence, which may include conversions on multiple channels, may be performed without central processing unit (CPU) involvement or expensive parameter data movement. More specifically, in response to selection of an input channel, a configured context associated with the input channel may be automatically accessed, used during a conversion, and saved without transferring parameter data in and/or out of the CPU. Further, in response to another input channel being selected for conversion, a configured context for the selected input channel may be automatically accessed, used during conversion, and saved without transferring parameter data in and/or out of the CPU. Thus, compared to conventional systems and methods, various embodiments may reduce, and possibly eliminate, the need for CPU involvement in time and memory consuming parameter data movement. Further, in at least some embodiments, switching from one context to another context (e.g., during a programmed sequence) may occur substantially instantaneously as seen by a software driver and may ease software driver development.

For at least these reasons, various embodiments of the present disclosure, as described more fully herein, provide a technical solution to one or more problems that arise from technology that could not reasonably be performed by a person, and various embodiments disclosed herein are rooted in computer technology in order to overcome the problems and/or challenges described above. Further, at least some embodiments disclosed herein may improve computer-related technology by allowing computer performance of a function not previously performable by a computer.

Embodiments of the present disclosure will be explained with reference to the accompanying drawings.

FIG. 1 is a block diagram of an example device 100, according to various embodiments of the present disclosure. Device 100, which may also be referred to herein as an "ADC controller," includes a number of analog input channels 102_1-102_M. Further, device 100 includes a number of contexts 104_1-104_N. Device 100 also includes an input channel selector 106, an analog-to-digital converter (ADC) 108, a context selector 110, and a sequencer 112. Moreover, device 100 includes a peripheral bus 114, which may be coupled to context selector 110, contexts 104_1-104_N, and sequencer 112. Peripheral bus 114 may further be coupled to a central processing unit (not shown in FIG. 1).

In at least some embodiments, each context 104_1-104_N may include a results storage 116 (e.g., including one or more data registers) and a context configuration unit 118.

Further, as described more fully below, each context 104_1-104_N may include a number of registers (not shown in FIG. 1), including a set of special function registers (SFRs), which may at least partially define a context configuration.

In some embodiments, each input channel 102_1-102_M may be associated with a context 104_1-104_M. In these embodiments, variable M may be equal to variable N. In other embodiments, only a subset of input channels 102_1-102_M may be associated with a context, or a context may be associated with more than one input channel. Thus, in these embodiments, variable M may not be equal to variable N.

For example only, a first analog input channel (e.g., input channel 102_1), which may be configured to receive a signal from, for example, a strain gauge, may be associated with a first context (e.g., context 104_1). Further, a second analog input channel (e.g., input channel 102_2), which may be configured to receive a signal from, for example, a temperature sensor, may be associated with a second context (e.g., context 104_2). Moreover, a third analog input channel (e.g., input channel 102_M), which may be configured to receive a signal from, for example, a capacitive sensor, may be associated with a third context (e.g., context 104_M). Thus, in this example, the first context (e.g., context 104_1) may be associated with (e.g., programmed for) a strain gauge application, the second context (e.g., context 104_2) may be associated with (e.g., programmed for) a temperature sensor application, and the third context (e.g., context 104_M) may be associated with (e.g., programmed for) a capacitive sensor application. The previous example is provided for description purposes only, and the embodiments disclosed are not limited to any specific applications or input signals.

According to various embodiments, each context 104_1-104_N may be at least partially configured by a user (e.g., a programmer via a software application). More specifically, a user, via, for example, one or more interfaces, may select a context (e.g., context 104_1) via a user interface (e.g., via a context selection register (not shown in FIG. 1; see e.g., FIGS. 2A and 2B) displayed via a user interface), and software may configure the selected context via programming some combination of SFRs, sequencer 112, and context selector 110.

For example, the one or more user-settable parameters may include an input channel parameter (e.g., identifying an input channel to be associated with the selected context), one or more interrupt parameters (e.g., identifying one or more interrupt conditions for the selected context), a sequence enable parameter (e.g., identifying whether or not the context is to be included in a programmed conversion sequence), and/or one or more other operational parameters. For example, the one or more interrupt parameters of a selected context may be set via an A/D stop on interrupt bit (e.g., an ADSOI bit) of the selected context, and the sequence enable parameter of the context may be set via a channel scan enable bit (e.g., an ADCSEN bit) of the selected context. Further, as another example, another operational parameter of the selected context may be set via, for example, an A/D continuous operation enable bit (e.g., an ADCONT bit) of the selected context.

In some embodiments, the one or more parameters of a context may be set and/or stored via context configuration unit 118 of the context. For example, the user may configure (e.g., via a software application) contexts sequentially (e.g., via peripheral bus 114), and in no specific order, until each context (i.e., context 104_1-104_M) of device 100 is configured. In at least some embodiments, the contexts may be configured via software (e.g., through peripheral bus 114).

Further, context configuration unit 118 may be operatively coupled to input channel selector 106, context selector 110, or sequencer 112 and may be configured to convey (e.g., during operation) a signal to input channel selector 106 for selecting an appropriate analog input channel 102 (i.e., the input channel associated with the context). In addition, context configuration unit 118 may be operatively coupled to ADC 108 and may be configured to convey, for example, timing and/or setup information to ADC 108 for the context.

Input channel selector 106 may be configured to select an analog input channel of analog inputs 102_1-102_M to couple to an input of ADC 108. During operation, ADC 108 may be configured to receive an analog signal from a selected analog input channel and convey a digital signal to a results storage 116 of an associated context 104. Results storage 116 may be configured to store a digital signal received from ADC 108. As described more fully below, sequencer 112 may be configured for performing an automated A/D conversion sequence based on one or more configured contexts.

During one contemplated operation of device 100, a user (e.g., a programmer) may select a context (e.g., one of context 204_1-204_N) by writing to a control register (e.g., an ADC context selection (ADCTX); not shown in FIG. 1). Further, in response to selection of a context, an associated input channel may by loaded (e.g., by the user) and an A/D conversion status bit (e.g., ADGO bit) may be asserted (e.g., by the user). Thereafter, a conversion may be completed, the A/D conversion status may be cleared, and an interrupt for the selected context may be triggered. In some embodiments, during, or upon completion of the conversion, the user may select a different context (e.g., via changing the ADC transmit control register) to, for example, read a previous result and/or prepare for a subsequent conversion.

As disclosed above, a user (e.g., a programmer) may be presented (e.g., via an interface) with a context selection register for selection of a context. Further, in response to a user selecting a context (e.g., via the context selection register), the selected context including a number of special function registers (SFRs) may be presented to the user (e.g., via an interface). In some embodiments, a context may depict a configuration and possible a history of an ADC controller.

Figure 2A:
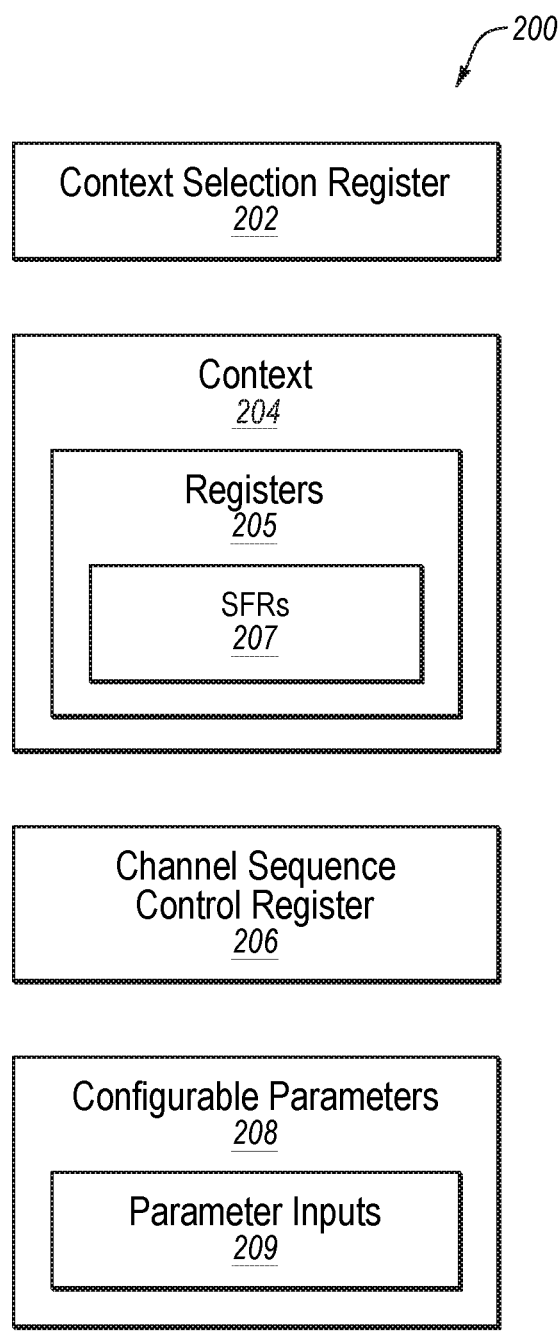
FIG. 2A depicts an example interface, according to one or more embodiments of the disclosure.

FIG. 2A is a block diagram illustrating an example interface 200, according to various embodiments of the present disclosure. Interface 200, which may include one or more interfaces, may be referred to herein as a "user interface" or a "programming interface."

Interface 200 includes a context selection register 202, a context 204, a channel sequence control register 206, and configurable parameters 208. In some embodiments, one or more elements shown in interface 200 may be included within one or more other elements. For example, in some embodiments, channel sequence control register 206 and/or configurable parameters 208 may be included within context 204. As a non-limiting example, context selection register 202 may be part of context selector 110 of FIG. 1, part of another component of device 100 of FIG. 1, or may be external to device 100 of FIG. 1.

Context selection register 202, in at least some embodiments, may include a plurality of settable bits, which may enable a user to select a context (e.g., for configuration). For example, a user may select one of contexts 104_1-104_N (see FIG. 1) via context selection register 202. In some embodiments, context selection register 202 may allow the user to select between: a context that is visible in an ADC controller data/configuration register by writing to bits of the context bits; and reading the context bits to show the current context. Further, context register may show values for a context (e.g., written values). For example, the value written may be read to confirm that the intended context has been selected.

Context 204 may include a number of registers 205, and in at least some embodiments, a set of registers (e.g., special function registers (SFRs)) 207 may be displayed to a software driver via interface 200. In some embodiments, context 204 may be displayed in response to the user selecting the context (e.g., via context selection register 202). Further, according to some embodiments, the set of registers (e.g., SFRs) may be visible to the user in a memory map, which may ease memory limitations.

In some embodiments, sets of registers for the various contexts may be internally independent. The same SFRs may be used to display a specific context, as selected by the context register. Alternatively, individual SFRs may be provided for each context. Both the shared set and individual sets may be provided within the same memory map, allowing the user (e.g., software) the option of addressing a context using the context selection register or by directly addressing a specific set. This option may be provided because, for example, the CPU addressing range is too small to allow access to the individual sets, but the wider addressing range of a direct memory access (DMA) subsystem may allow for more-convenient direct access.

Channel sequence control register 206, which, in at least some embodiments, may include a plurality of settable bits, may enable a user to set one or more parameters. For example, channel sequence control register 206 may enable a user to select whether or not a selected context may be included in an automated conversion sequence. Further, channel sequence control register 206 may enable the user to select whether, upon completion of a conversion utilizing the selected context, the conversion sequence continues to another enabled context. More specifically, for example, channel sequence control register 206 may enable a user to set one or more of an A/D channel scan enable bit (e.g., an ADCSEN bit) and a A/D software control bit (e.g., a ADSWC bit).

Configurable parameters 208, which, in at least some embodiments, may include a plurality of settable bits, may enable a user to set one or more parameters for the selected context. For example, a user may set one or more interrupt parameters for the selected context (e.g., A/D stop on interrupt bit (e.g., ADSOI bit)) and/or one or more other operational parameters for the selected context (e.g., an A/D continuous operation enable bit (e.g., ADCONT bit)). For example, the user may set the one or more parameters via parameter inputs 209.

Figure 2B:
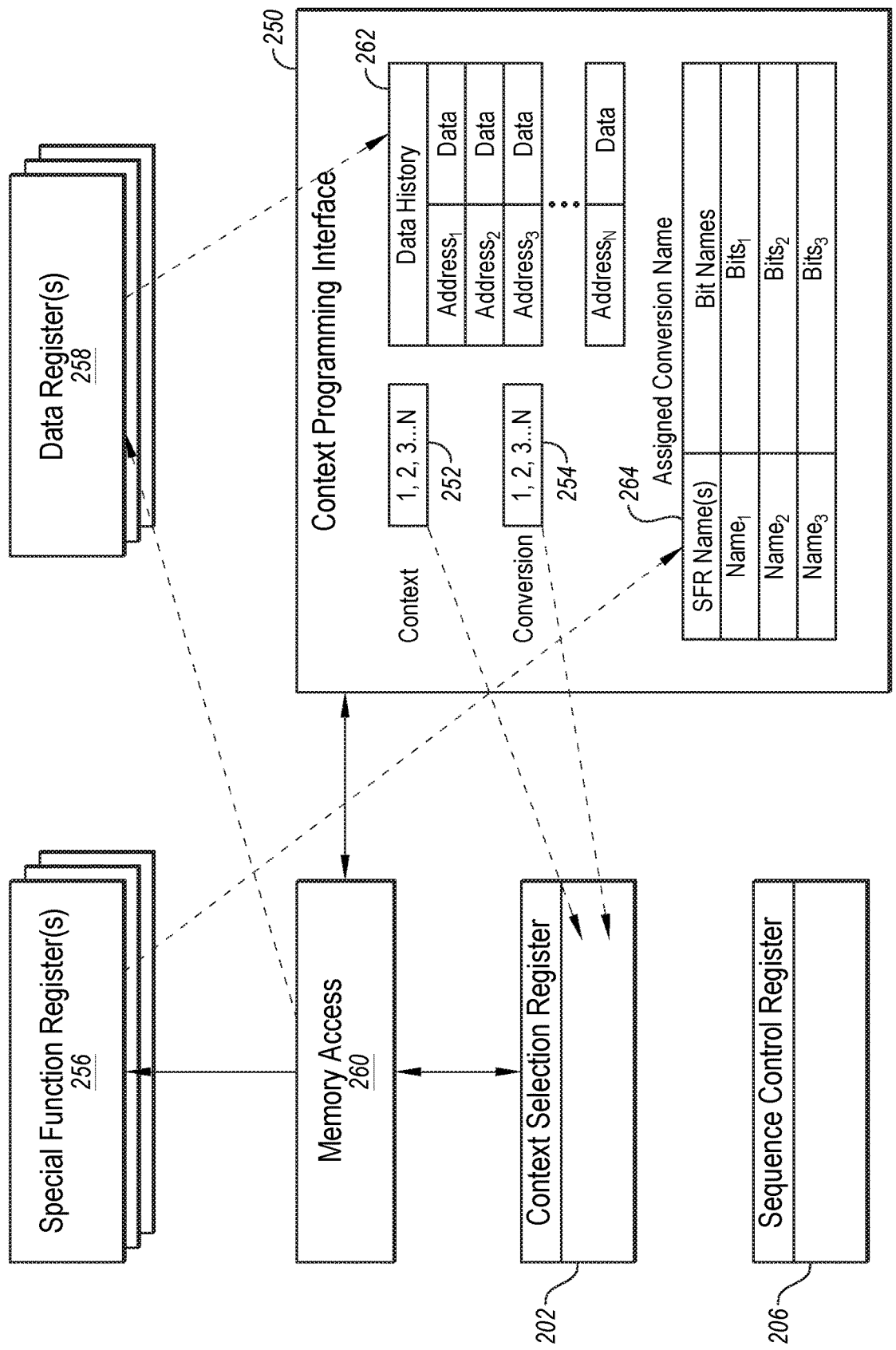
FIG. 2B illustrates an example system including a context programming interface, in accordance with one or more embodiments of the disclosure.

FIG. 2B illustrates an example context programming interface 250. For example, a user (e.g., a programmer) may input a context via input field 252 of context programming interface 250. Further, in at least some embodiments, the user may input a conversion channel for the selected context via input field 254 of context programming interface 250. Further, for example, the context and the conversion channel may be selected via context selection register 202. Further, in response to the selections, special function registers 256 and/or data registers 258 may be accessed (e.g., via memory access 260), and, in at least some embodiments, a data history 262 and at least some assigned conversions 264 may be displayed via context programming interface 250.

Figure 2C:
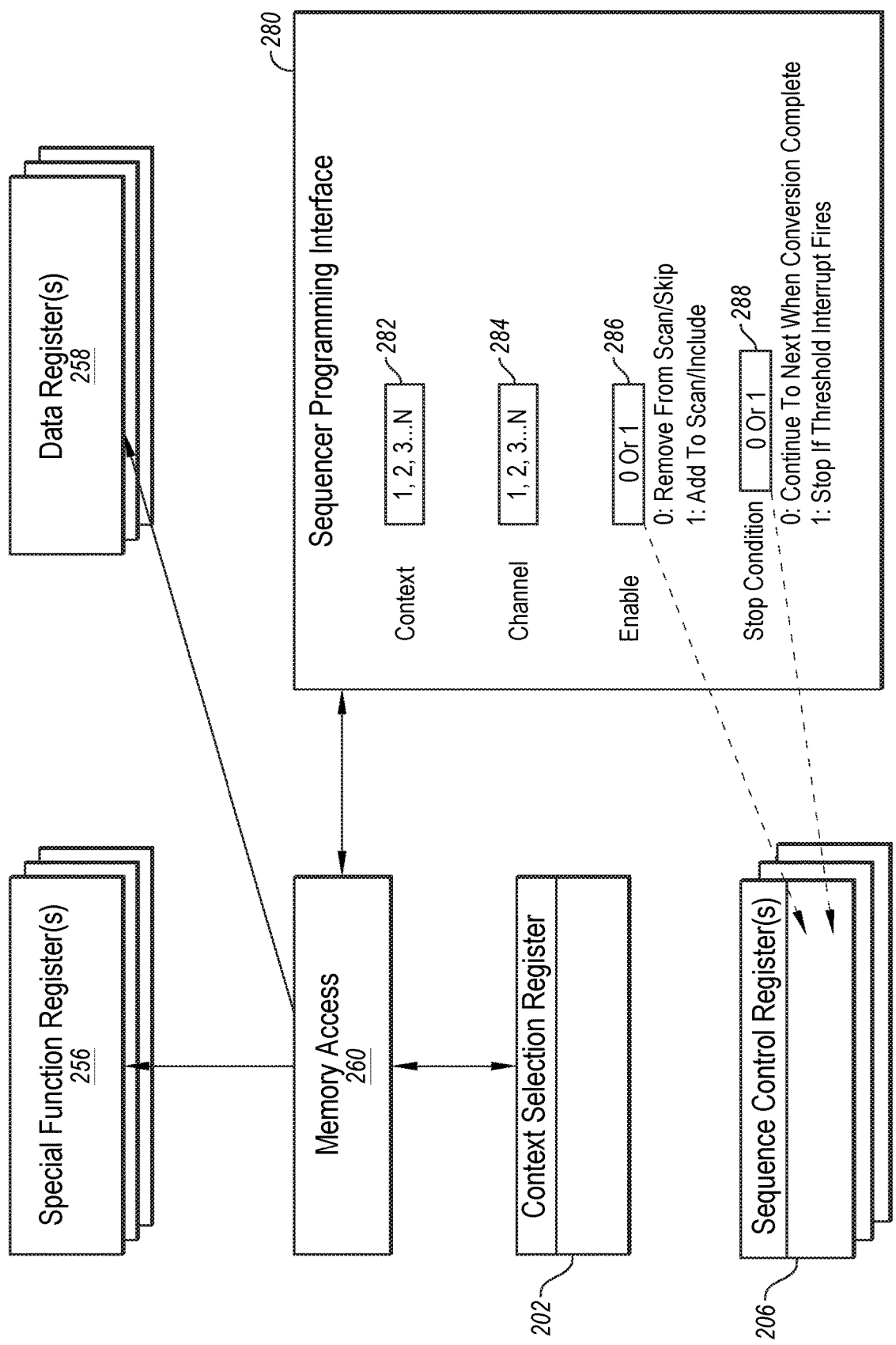
FIG. 2C illustrates an example system including a sequencer programming interface, according to one or more embodiments of the disclosure.

FIG. 2C illustrates an example sequencer programming interface 280. For example, a user (e.g., a programmer) may input a context via input field 282 of sequencer programming interface 280. Further, in at least some embodiments, the user may input a conversion for the selected context via input field 284 of sequencer programming interface 280. Moreover, the user may enter a value for an enable bit via input 286, and the user may enter a value for a stop condition bit via input 288. Moreover, for example, the enable and stop condition bits may be set via channel sequence control register 206.

In some embodiments, a device (e.g., device 100 of FIG. 1) may include a global enable register and/or a global stop register for one or more contexts of the device. For example, in an 8-bit register, bit 7 may correspond to context 0, bit 6 may correspond to context 1, bit 5 may correspond to context 2, and so on. In other embodiments, each context may include a dedicated sequence control register.

The interfaces shown in FIGS. 2A-2C are provided as non-limiting examples, and a person having ordinary skill in the art will appreciate that other interfaces may be used to, for example, program contexts and/or program conversion sequences.

Figure 3:
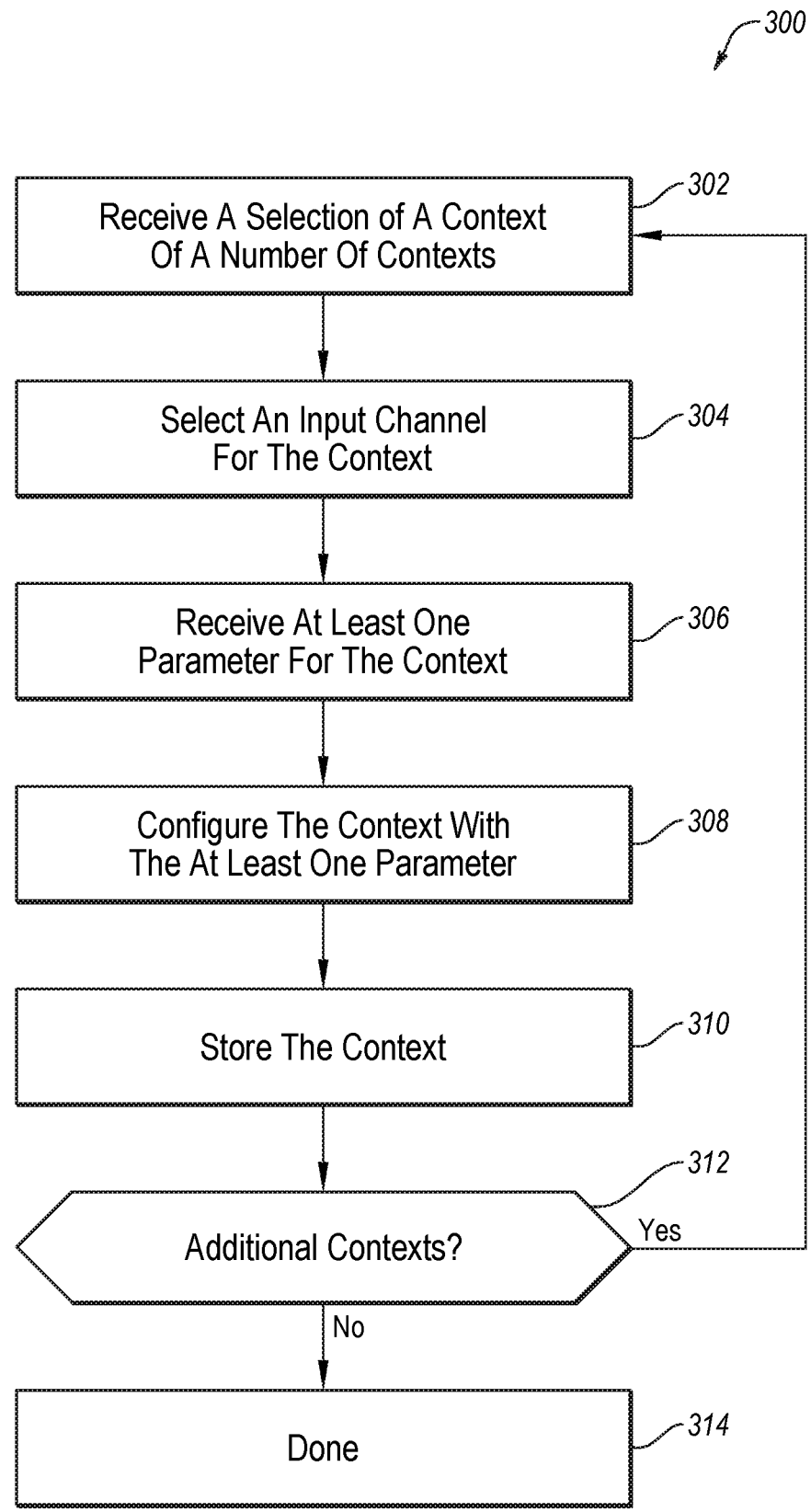
FIG. 3 illustrates an example flow diagram of a method of configuring a number of contexts of an ADC controller.

FIG. 3 is a flowchart of an example method 300 of configuring a number of contexts for an ADC controller. Method 300 may be arranged in accordance with at least one embodiment described in the present disclosure. Method 300 may be performed, in some embodiments, by a device or system, such as device 100 of FIG. 1, interface 200 of FIG. 2A, context programming interface 250 of FIG. 2B, one or more of the components thereof, or another system or device. In these and other embodiments, method 300 may be performed based on the execution of instructions stored on one or more non-transitory computer-readable medium. Although illustrated as discrete blocks, various blocks may be divided into additional blocks, combined into fewer blocks, or eliminated, depending on the desired implementation.

Method 300 may begin at block 302, where a selection of a context of a number of contexts may be received, and method 300 may proceed to block 304. For example, the selection of the context (e.g., context 104_1 of FIG. 1) may be received via at least one interface (e.g., context programming interface 250 of FIG. 2B). Further, for example, the selection of the context may be received in response to a user (e.g., a programmer) selecting (e.g., via a software application) the context via a context selection register (e.g., context selection register 202 of FIGS. 2A and 2B).

At block 304, an input channel for the context may be selected, and method 300 may proceed to block 306. For example, in at least one embodiment, the input channel of a number of input channels (e.g., 102_1-102_M of FIG. 1) may be selected by the user and received via at least one interface (e.g., interface 200 of FIG. 2A). In other embodiments, the input channel may be selected by a device or system (e.g., device 100) (e.g., in response to selection of the first context).

At block 306, at least one parameter for the context may be received, and method 300 may proceed to block 308. For example, the at least one parameter for the context may be received from the user via at least one interface (e.g., interface 200 of FIG. 2A). More specifically, for example, the at least one parameter for the context may be received from the user via channel sequence control register 206 and/or parameter inputs 209 of FIG. 2A. In some embodiments, the at least one parameter may include a sequence enable parameter identifying whether or not the context may be included in an automated conversion sequence (e.g., selected via a A/D channel scan enable bit (e.g., ADCSEN bit) and/or a A/D software control bit (e.g., ADSWC bit)).

Further, the at least one parameter may include one or more interrupt parameters for the context (e.g., A/D stop on interrupt bit (e.g., ADSOI bit)) and/or one or more other operational parameters for the context (e.g., an A/D continuous operation enable bit (e.g., ADCONT bit)).

At block 308, the context may be configured with the at least one parameter, and method 300 may proceed to block 310. For example, the one or more bits of the context may be set to configure the context with the at least one parameter. At block 310, the context may be stored, and method 300 may proceed to block 312. For example, the context (e.g., context 104_1 of FIG. 1) may be stored as a configured context in device 100 (see FIG. 1).

At block 312, a determination may be made as to whether there are additional contexts that have not yet been configured. If there are additional contexts, method 300 may return to block 302. If there are no additional contexts, method 300 may proceed to block 314, where method 300 may end.

Modifications, additions, or omissions may be made to method 300 without departing from the scope of the present disclosure. For example, the operations of method 300 may be implemented in differing order. Furthermore, the outlined operations and actions are only provided as examples, and some of the operations and actions may be optional, combined into fewer operations and actions, or expanded into additional operations and actions without detracting from the essence of the disclosed embodiment.

As disclosed above, sequencer 112 (see FIG. 1) may be configured for performing an automated A/D conversion based on a programmed sequence. More specifically, for example, based on a configuration (e.g., user-defined configuration) of one or more contexts 104_1-104_N, sequencer 112, which may include, for example, a state-machine, may perform an automated A/D conversion based on a programmed sequence. In some embodiments, an automated A/D conversion may include automatically cycling through conversions on different channels. In these and other embodiments, upon completion of a conversion on an input channel, a context for a subsequent conversion may be automatically selected. In some embodiments, automation may allow a CPU to remain in a sleep mode (e.g., to save power) and wake up only if one or more conditions are met. In some embodiments, a context may be associated with one or more unique threshold interrupts, and an option (e.g., a user option) may be provided to continue or stop on an interrupt condition to handle a change in condition.

With reference again to FIG. 1, during a contemplated operation of device 100, sequencer 112 may begin a conversion sequence with a first context (e.g., context 104_1) and proceed in order with contexts having enabled channel scan enable bits. In some embodiments, a conversion sequence may begin in response to an A/D conversion status bit (e.g., ADGO bit) being asserted (e.g., via software) and/or in response to an external trigger. For each input channel, a conversion indicated by an associated enabled context may be performed, and, based on, for example, an A/D continuous operation enable bit (e.g., ADCONT bit) and an A/D stop on interrupt bit (e.g., ADSOI bit), a subsequent channel may be converted. For example, if the A/D continuous operation enable bit is asserted (e.g., set to 1 by the user) in every context, upon completion of a conversion sequence, another conversion sequence may start with the first context and continue to each subsequent context. If the A/D continuous operation enable bit is not asserted (e.g., set to 0 by the user), a conversion sequence may stop after a channel associated with a selected context has been converted.

Further, in some embodiments, during and/or upon completion of a conversion sequence, a context interrupt may fire if one or more threshold conditions are met. For example, if an A/D stop on interrupt bit (e.g., ADSOI bit) for a selected context is asserted and the context interrupt fires, the conversion sequence may cease. In either case, the input channel number for the context may be changed (e.g., by the user), and a conversion may be performed on a different input channel.

Further, according to some embodiments, an automated programmed conversion sequence may include more than one phase, and conversions performed by sequencer 112 may vary depending on a phase of the programmed conversion sequence. More specifically, in an example wherein device 100 is implemented in a washing machine, device 100 may include four contexts. A first context (e.g., context 104_1 of FIG. 1), which in this example is associated with a first input channel (e.g., input channel 102_1 of FIG. 1), may be associated with a first button (e.g., an input button, such as a start button) on the washing machine. A second context (e.g., context 104_2 of FIG. 1), which in this example is associated with a second input channel (e.g., input channel 102_2 of FIG. 1), may be associated with a second button (e.g., an input button, such as a stop button) of the washing machine. Further, a third context (e.g., context 104_3; not shown in FIG. 1), which in this example is associated with a third input channel (e.g., input channel 102_3; not shown in FIG. 1), may be associated with an operational state of a motor of the washing machine (e.g., whether or not the motor is running). Moreover, a fourth context (e.g., context 104_4; not shown in FIG. 1), which in this example is associated with a fourth input channel (e.g., input channel 102_4; not shown in FIG. 1), may be associated with a temperature of the water in the washing machine.

Continuing with this example, the temperature of the water in the washing machine may not change quickly; however, each of the first button and the second button may be selected at any time. In addition, a state of the motor of the washing machine may change at any time. Thus, in this example, a user (e.g., a programmer) may wish to configure device 100, and more specifically sequencer 112, such that contexts 104_1-104_3 are checked frequently, and context 104_4 is only checked occasionally (e.g., once every five minutes). Thus, sequencer 112 may be configured to include contexts 104_1-104_3 during a first phase of a programmed conversion sequence (e.g., for the first five minutes). Further, sequencer 112 may be configured to include contexts 104_1-104_4 during a second phase of the programmed conversion sequence (e.g., one loop of a scan includes all four contexts). Moreover, after the water temperature is checked, during a third phase of the programmed conversion sequence (e.g., for the next five minutes), sequencer 112 may be configured to include contexts 104_1-104_3.

Figure 4:
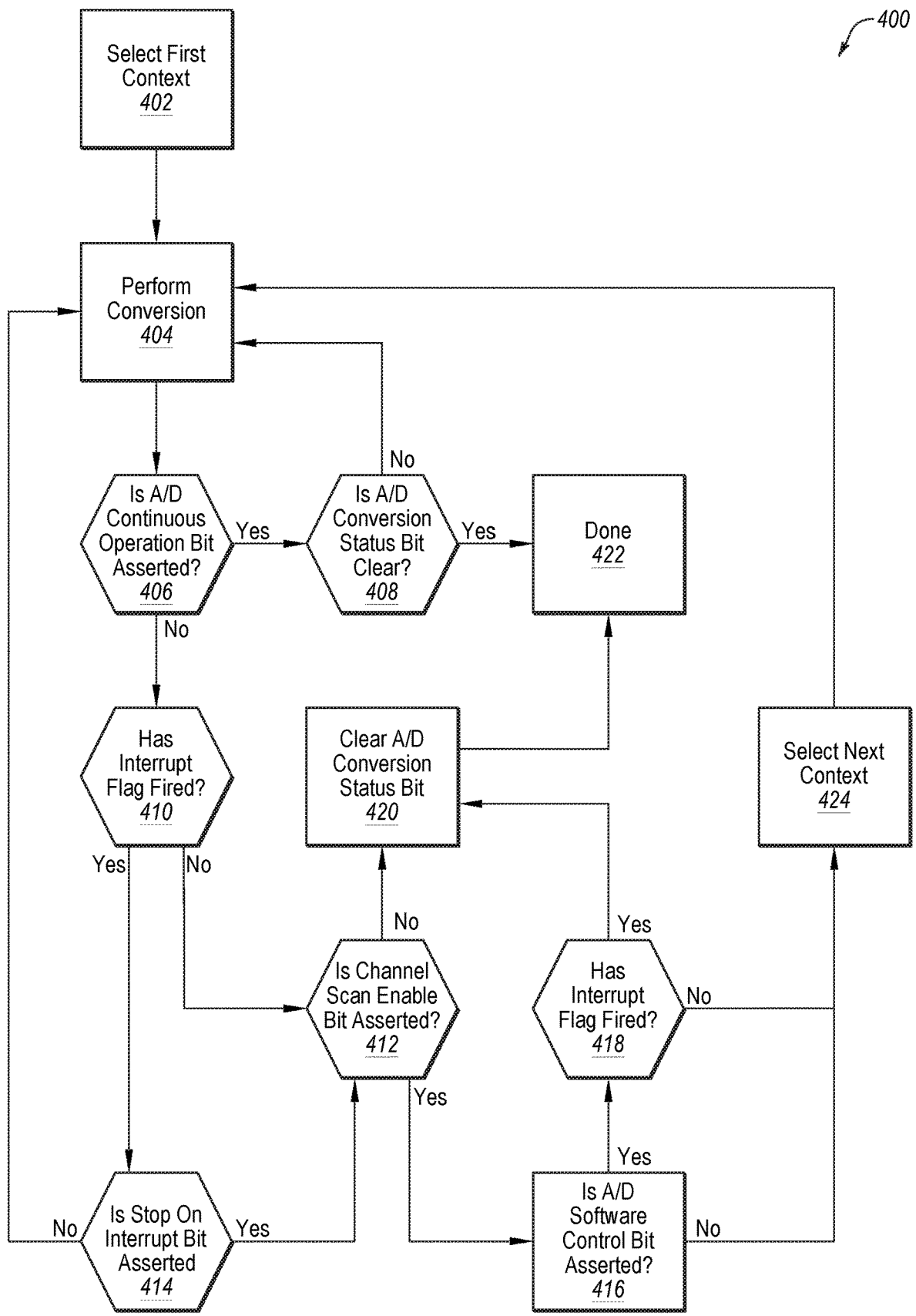
FIG. 4 illustrates an example flow diagram of a method of performing an analog-to-digital (A/D) programmed conversion sequence.

FIG. 4 is a flowchart of an example method 400 of performing an A/D programmed conversion sequence. Method 400 may be arranged in accordance with at least one embodiment described in the present disclosure. Method 400 may be performed, in some embodiments, by a device or system, such as device 100, interface 200 of FIG. 2A, context programming interface 250 of FIG. 2B, sequencer programming interface 280 of FIG. 2C, one or more of the components thereof, or another system or device. In these and other embodiments, method 400 may be performed based on the execution of instructions stored on one or more non-transitory computer-readable media. Although illustrated as discrete blocks, various blocks may be divided into additional blocks, combined into fewer blocks, or eliminated, depending on the desired implementation.

Method 400 may begin at block 402, where a first context may be selected, and method 400 may proceed to block 404. For example, a first context (e.g., context 104_1 of FIG. 1), which is associated with a first analog input channel (e.g., input channel 102_1 of FIG. 1), may be selected via device 100, and more specifically, via sequencer 112 and/or context selector 110 of FIG. 1. More specifically, for example, sequencer 112 may determine, based on a programmed sequence, which context of a number of contexts to select. More specifically, based on one or more user-defined parameters of one or more contexts, sequencer 112 may determine which context to select. Further, in some embodiments, in response to a command from sequencer 112, context selector 110 may select the context.

At block 404, an input signal of a first input channel associated with the first context may be converted, and method 400 may proceed to block 406. For example, an input signal of the first analog input channel (e.g., input channel 102_1 of FIG. 1) may be converted to a digital signal via ADC 108 of FIG. 1. More specifically, for example, in response to a signal from context configuration unit 118 of FIG. 1, input channel selector 106 may selectively couple the first input channel to ADC 108, which may convert an input signal on the first input channel to a digital signal. For example, the digital signal may be stored at results storage 116 (see FIG. 1).

At block 406, a determination may be made as to whether an A/D continuous operation bit of the first context is asserted (e.g., set to 1). If the A/D continuous operation bit is asserted, method 400 may proceed to block 408. If the A/D continuous operation bit is not asserted (e.g., set to 0), method 400 may proceed to block 410. For example, the determination as to whether the A/D continuous operation bit of the first context is asserted may be made via context configuration unit 118.

At block 408, a determination may be made as to whether an A/D conversion status bit of the first context is clear. If the A/D conversion status bit is not clear, method 400 may return to block 404. If the A/D conversion status bit is clear, method 400 may proceed to block 422, where method 400 may end. For example, the determination as to whether the A/D conversion status bit of the first context is clear may be made via context configuration unit 118.

At block 410, a determination may be made as to whether an interrupt flag of the first context has fired. If the interrupt flag has not fired, method 400 may proceed to block 412. If the interrupt flag has fired, method 400 may proceed to block 414. For example, the determination as to whether the interrupt flag of the first context has fired may be made via context configuration unit 118.

At block 414, a determination may be made as to whether a stop on interrupt bit of the first context is asserted (e.g., set to 1). If the stop on interrupt bit is asserted, method 400 may proceed to block 412. If the stop on interrupt bit is not asserted (e.g., set to 0), method 400 may return to block 404. For example, the determination as to whether the stop on interrupt bit of the first context is asserted may be made via context configuration unit 118.

At block 412, a determination may be made as to whether a channel scan enable bit of the first context is asserted (e.g., set to 1). If the channel scan enable bit is asserted, method 400 may proceed to block 416. If the channel scan enable bit is not asserted (e.g., set to 0), method 400 may proceed to block 420. For example, the determination as to whether the channel scan enable bit of the first context is asserted may be made via context configuration unit 118.

At block 416, a determination may be made as to whether an A/D software control bit of the first context is asserted (e.g., set to 1). If the A/D software control bit is asserted, method 400 may proceed to block 418. If the A/D software control bit is not asserted (e.g., set to 0), method 400 may proceed to block 424. For example, the determination as to whether the A/D software control bit of the first context is asserted may be made via context configuration unit 118.

At block 418, a determination may be made as to whether an interrupt flag of the first context has fired. If the interrupt flag has not fired, method 400 may proceed to block 424. If the interrupt flag has fired, method 400 may proceed to block 420. For example, the determination as to whether the interrupt flag of the first context has fired may be made via context configuration unit 118.

At block 420, an A/D status conversion bit of the first context may be cleared, and method 400 may proceed to block 422, where method 400 may end. For example, the A/D status conversion bit of the first context may be cleared via context configuration unit 118.

At block 424, the next context may be selected, and method 400 may return to block 404. For example, a second context (e.g., context 104_2 of FIG. 1) associated with an analog input channel (e.g., input channel 102_2 of FIG. 1) may be selected via device 100, and more specifically, via sequencer 112 and/or context selector 110 of FIG. 1. More specifically, for example, sequencer 112 may determine, based on a programmed sequence, which context to select. More specifically, based on one or more user-defined parameters of one or more contexts, sequencer 112 may determine which context to select. Further, in some embodiments, in response to a command from sequencer 112, context selector 110 may select the next context.

Modifications, additions, or omissions may be made to method 400 without departing from the scope of the present disclosure. For example, the operations of method 400 may be implemented in differing order. Furthermore, the outlined operations and actions are only provided as examples, and some of the operations and actions may be optional, combined into fewer operations and actions, or expanded into additional operations and actions without detracting from the essence of the disclosed embodiment.

In addition to other benefits and advantages, as described herein, various embodiments of the disclosure may be compatible with conventional software drivers. For example, in some embodiments, a conventional programming interface may be used for programming one or more contexts and/or programming a conversion sequence. Further, in some embodiments wherein a sequencer (e.g., sequencer 112 of FIG. 1) is not used, software may include a context and may invoke the same software driver for each context. Moreover, various embodiments may allow for low power sensor/button scanning while a CPU is asleep, even if characteristics of the buttons and/or sensors are different.

In traditional systems with only a single context register set, the software driver maintains a set of values in memory that will eventually be copied into the context registers, so as not to interfere with other processes concurrently setting up other contexts. In some embodiments, a (e.g., standard) programming interface may allow a programmer to piecewise configure a context (e.g., one of contexts 104). Upon completion of set-up, memory data may be copied into, for example, a context register set before triggering a conversion. Further, in some embodiments, a driver may directly load all or parts of a context (e.g., context 104_1; see FIG. 1) while a separate process may be loading other contexts (e.g., context 104_2 or context 104_M) or performing a conversion on another context.

With reference again to FIG. 2, a driver for each process may address registers 205 via use of context selection register 202 and load all or part of a context. For example, it may take one or more programming interface calls to complete a configuration, depending on a design of an interface and/or requirements of a program. Thus, this task may take time to complete during which an operating system may suspend this process and allow other processes to run. In some embodiments, various processes must share access to context selection register 202 (and thus context registers 205) using any of the well-known programming techniques for this task. Alternatively, if each context 104 is provided unique addressing, a driver for one process could (e.g., directly) piecewise set up one context while other contexts are being set up, without concern for sharing of registers 205 and context selection register 202.

Many of the functional units described in this specification may be illustrated, described or labeled as modules, threads, or other segregations of programming code, in order to more particularly emphasize their implementation independence. Modules may be at least partially implemented in hardware, in one form or another. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

As used in the present disclosure, the terms "module" or "component" may refer to specific hardware implementations configured to perform the actions of the module or component and/or software objects or software routines that may be stored on and/or executed by general purpose hardware (e.g., computer-readable media, processing devices, etc.) of the computing system. In some embodiments, the different components, modules, engines, and services described in the present disclosure may be implemented as objects or processes that execute on the computing system (e.g., as separate threads). While some of the system and methods described in the present disclosure are generally described as being implemented in software (stored on and/or executed by general purpose hardware), specific hardware implementations or a combination of software and specific hardware implementations are also possible and contemplated.

Terms used in the present disclosure and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additional non-limiting embodiments of the disclosure include:

Embodiment 1: a method of configuring a number of contexts for an analog-to-digital converter (ADC) controller, comprising: receiving, via at least one interface, a selection of a first context of a number of contexts, each context of the number of contexts including a number of registers; receiving, via the at least interface, at least one parameter for the first context; configuring the first context with the at least one parameter for the first context; storing the first context as a first configured context of the ADC controller; receiving, via at least one interface, a selection of a second context of the number of contexts; receiving, via the at least interface, at least one parameter for the second context; configuring the second context with the at least one parameter for the second context; and storing the second context as a second configured context of the ADC controller.

Embodiment 2: the method of Embodiment 1, further comprising: displaying, via the at least one interface, a set of special function registers of a number of registers for the first context in response to the selection of the first context; and displaying, via the at least one interface, a set of special function registers of a number of registers for the second context in response to the selection of the second context.

Embodiment 3: the method of any of Embodiments 1 and 2, wherein the receiving the at least one parameter for the first context comprises receiving at least one of a sequence enable parameter and an interrupt parameter for the first context.

Embodiment 4: the method of any of Embodiments 1 to 3, wherein the receiving the selection of the first context comprises receiving the selection of the first context via a context selection register displayed via the at least one interface.

Embodiment 5: the method of any of Embodiments 1 to 4, further comprising selecting an input channel for the first context in response to receipt of the selection of the first context.

Embodiment 6: the method of any of Embodiments 1 to 5, wherein the receiving the at least one parameter for the first context comprises receiving at least one of a sequence enable parameter via a channel sequence control register displayed via the at least one interface.

Embodiment 7: an analog-to-digital converter (ADC) controller, the ADC controller comprising: a number of input channels; an ADC selectively coupled to each input channel of the number of input channels; a number of contexts operatively coupled to the ADC, each context associated with an input channel of the number of input channels, each context having at least one configurable parameter; and a sequencer operatively coupled to the number of context and configured to perform a programmed conversion sequence on one or more input channels of the number of input channels based on one or more configurable parameters of one or more contexts of the number of contexts.

Embodiment 8: the ADC controller of Embodiment 7, wherein one configurable parameter of the at least one configurable parameter of each context indicates whether the context is to be included in the programmed conversion sequence.

Embodiment 9: the ADC controller of any of Embodiments 7 and 8, wherein the at least one configurable parameter that indicates whether or not the context is to be included in the programmed conversion sequence comprises a sequence enable bit.

Embodiment 10: the ADC controller of any of Embodiments 7 to 9, wherein one configurable parameter of the at least one configurable parameter of each context comprises an interrupt parameter.

Embodiment 11: the ADC controller of any of Embodiments 7 to 10, further comprising a context selector operatively coupled to the sequencer and configured to select a context of the number of contexts based on the programmed conversion sequence.

Embodiment 12: the ADC controller of any of Embodiments 7 to 11, further comprising a peripheral bus operatively coupled to each of the number of contexts and the sequencer.

Embodiment 13: the ADC controller of any of Embodiments 7 to 12, wherein each context is configured to receive a signal via the peripheral bus for configuring the at least one configurable parameter.

Embodiment 14: the ADC controller of any of Embodiments 7 to 13, further comprising an input channel selector operatively coupled between the number of contexts and the number of input channels, the input channel selector configured to select an input channel of the number of input channels based on a signal from at least one of the number of contexts.

Embodiment 15: a method of performing an analog-to-digital (A/D) conversion sequence, the method comprising: converting an input signal of a first input channel associated with a first context of a number of contexts to a first digital signal; determining if a continuous operation bit of the first context is asserted; determining if a sequence enable bit of the first context is asserted; in response to determining that the continuous operation bit of the first context is not asserted and the sequence enable bit of the first context is asserted, selecting a second context of the number of contexts; and converting an input signal of a second input channel associated with the second context to a second digital signal.

Embodiment 16: the method of Embodiment 15, further comprising: determining if a continuous operation bit of the second context is asserted; determining if a sequence enable bit of the second context is asserted; in response to determining that the continuous operation bit of the second context is not asserted and the sequence enable bit of the second context is asserted, selecting a third context of the number of contexts; and converting an input signal of a third input channel associated with the third context to a digital signal.

Embodiment 17: the method of any of Embodiments 15 and 16, further comprising: determining if an interrupt flag of the first context has been triggered; in response to determining that the interrupt flag of the first context has been triggered, determining if a stop on interrupt bit is asserted; and in response to determining that the stop on interrupt bit of the first context is not asserted, converting the input signal of the first input channel associated with the first context to the first digital signal.

Embodiment 18: the method of any of Embodiments 15 to 17, further comprising in response to determining that either the continuous operation bit of the first context is asserted or the sequence enable bit of the first context is not asserted, clearing an A/D conversion status bit of the first context Embodiment 19: the method of any of Embodiments 15 to 18, further comprising detecting a trigger prior to converting the input signal of the first input channel.

Embodiment 20: the method of any of Embodiments 15 to 19, further comprising asserting an analog-to-digital (A/D) conversion status bit prior to converting the input signal of the first input channel.

While the present disclosure has been described herein with respect to certain illustrated embodiments, those of ordinary skill in the art will recognize and appreciate that the present invention is not so limited. Rather, many additions, deletions, and modifications to the illustrated and described embodiments may be made without departing from the scope of the invention as hereinafter claimed along with their legal equivalents. In addition, features from one embodiment may be combined with features of another embodiment while still being encompassed within the scope of the invention as contemplated by the inventor.

What is claimed is:

1. A method of configuring a number of contexts for an analog-to-digital converter (ADC) controller, comprising:
   receiving a selection of a first context of a number of contexts, each context of the number of contexts including a number of registers;
   receiving at least one parameter for the first context;
   configuring the first context with the at least one parameter for the first context, the at least one parameter for the first context including at least one of a sequence enable bit for the first context or a continuous operation bit for the first context;
   storing the first context as a first configured context of the ADC controller;
   receiving a selection of at least one additional context of the number of contexts;
   receiving at least one parameter for the at least one additional context;
   configuring the at least one additional context with the at least one parameter for the at least one additional context, the at least one parameter for the at least one additional context including at least one of a sequence enable bit for the at least one additional context or a continuous operation bit for the at least one additional context; and
   storing the at least one additional context as at least one additional configured context of the ADC controller.

2. The method of claim 1, further comprising:
   displaying a set of special function registers of a number of registers for the first context in response to the selection of the first context; and
   displaying a set of special function registers of a number of registers for the at least one additional context in response to the selection of the at least one additional context.

3. The method of claim 1, wherein the receiving the at least one parameter for the first context comprises receiving at least one of a sequence enable parameter and an interrupt parameter for the first context.

4. The method of claim 1, wherein the receiving the selection of the first context comprises receiving, via at least one interface, the selection of the first context via a context selection register displayed via the at least one interface.

5. The method of claim 1, further comprising selecting an input channel for the first context in response to receipt of the selection of the first context.

6. The method of claim 1, wherein the receiving the at least one parameter for the first context comprises receiving, via at least one interface, at least one of a sequence enable parameter via a channel sequence control register displayed via the at least one interface.

7. An analog-to-digital converter (ADC) controller, the ADC controller comprising:
   a number of contexts configured for coupling to an ADC, each context having at least one register for storing at least one configurable parameter; and
   a sequencer operatively coupled to the number of contexts and configured to perform a programmed conversion sequence based on one or more configurable parameters of one or more contexts of the number of contexts.

8. The ADC controller of claim 7, wherein one configurable parameter of the one or more configurable parameters indicates whether the context is to be included in the programmed conversion sequence.

9. The ADC controller of claim 8, wherein the one configurable parameter that indicates whether or not the context is to be included in the programmed conversion sequence comprises a sequence enable bit.

10. The ADC controller of claim 7, wherein one configurable parameter of the at least one configurable parameter of each context comprises an interrupt parameter.

11. The ADC controller of claim 7, further comprising a context selector operatively coupled to the sequencer and configured to select a context of the number of contexts based on the programmed conversion sequence.

12. The ADC controller of claim 7, further comprising a peripheral bus operatively coupled to each of the number of contexts and the sequencer.

13. The ADC controller of claim 12, wherein each context is configured to receive a signal via the peripheral bus for configuring the at least one configurable parameter.

14. The ADC controller of claim 7, further comprising an input channel selector operatively coupled between the number of contexts and a number of input channels, the input channel selector configured to select an input channel of the number of input channels based on a signal from at least one of the number of contexts.

15. A method of performing an analog-to-digital (A/D) conversion sequence, the method comprising:
   determining if a continuous operation bit of a first context of a number of contexts is asserted;
   determining if a sequence enable bit of the first context is asserted;
   in response to determining that the continuous operation bit of the first context is not asserted and the sequence enable bit of the first context is asserted, selecting a second context of the number of contexts; and
   converting an input signal of an input channel associated with the second context to a digital signal.

16. The method of claim 15, further comprising:
   determining if a continuous operation bit of the second context is asserted;
   determining if a sequence enable bit of the second context is asserted;

in response to determining that the continuous operation bit of the second context is not asserted and the sequence enable bit of the second context is asserted, selecting a third context of the number of contexts; and converting an input signal of an input channel associated with the third context to a digital signal.

17. The method of claim 15, further comprising:

determining if an interrupt flag for the first context has been triggered;

in response to determining that the interrupt flag for the first context has been triggered, determining if a stop on interrupt bit of the first context is asserted; and in response to determining that the stop on interrupt bit of the first context is not asserted, converting an input signal of an input channel associated with the first context to a digital signal.

18. The method of claim 15, further comprising in response to determining that either the continuous operation bit of the first context is asserted or the sequence enable bit of the first context is not asserted, clearing an A/D conversion status bit of the first context.

19. The method of claim 15, further comprising detecting a trigger prior to converting an input signal of an input channel.

20. The method of claim 15, further comprising asserting an analog-to-digital (A/D) conversion status bit prior to converting an input signal of an input channel.

* * * * *